US012656676B2

(12) United States Patent
    Hsieh et al.

(10) Patent No.: US 12,656,676 B2
(45) Date of Patent: Jun. 16, 2026

(54) EXTREME ULTRAVIOLET MASK AND METHOD OF MANUFACTURING THE SAME

(71) Applicant: TAIWAN SEMICONDUCTOR MANUFACTURING CO., LTD., Hsinchu (TW)

(72) Inventors: Wei-Che Hsieh, Taipei (TW); Tzu-Yi Wang, Hsinchu City (TW); Ping-Hsun Lin, New Taipei City (TW); Ta-Cheng Lien, Cyonglin Township (TW); Hsin-Chang Lee, Hsinchu County (TW); Huan-Ling Lee, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 287 days.

(21) Appl. No.: 17/086,299

(22) Filed: Oct. 30, 2020

(65) Prior Publication Data

US 2021/0333717 A1      Oct. 28, 2021

Related U.S. Application Data

(60) Provisional application No. 63/014,391, filed on Apr. 23, 2020.

(51) Int. Cl.
    *G03F 1/80*          (2012.01)
    *G03F 1/24*          (2012.01)
    (Continued)

(52) U.S. Cl.
    CPC .................. *G03F 1/80* (2013.01); *G03F 1/24* (2013.01); *G03F 1/38* (2013.01); *G03F 7/091* (2013.01)

(58) Field of Classification Search
    CPC ..... G03F 1/80; G03F 1/24; G03F 1/38; G03F 7/091; H05G 2/008
    See application file for complete search history.

(56) References Cited

U.S. PATENT DOCUMENTS

| | | | | |
|---|---|---|---|---|
| 6,514,877 B1 * | 2/2003 | Beauvais | ............... | B82Y 10/00 430/5 |
| 8,563,431 B2 | 10/2013 | Miyairi et al. | | |

(Continued)

FOREIGN PATENT DOCUMENTS

| | | |
|---|---|---|
| CN | 109669318 A | 4/2019 |
| JP | 5122422 B2 | 1/2013 |

(Continued)

OTHER PUBLICATIONS

Tantiboro Ouattara et al., "EUV assist layers for use in multilayer processes", Proc. SPIE 8322, Extreme Ultraviolet (EUV) Lithography III, 83222E (Mar. 23, 2012); <https://doi.org/10.1117/12.916469>.

*Primary Examiner* — Jonathan Johnson
*Assistant Examiner* — Jayson D Cosgrove
(74) *Attorney, Agent, or Firm* — STUDEBAKER BRACKETT PLLC

(57) ABSTRACT

A method of fabricating a mask is provided. The method includes providing a hard mask layer disposed on top of absorber, a capping layer, and a multilayer that are disposed on a substrate. The method includes forming a middle layer over the hard mask layer, forming a photo resist layer over the middle layer, patterning the photo resist layer, etching the middle layer through the patterned photo resist layer, etching the hard mask layer through the patterned middle layer, and etching the absorber through the patterned hard mask layer. In some embodiments, etching the hard mask layer through the patterned middle layer includes a dry-etching process that has a first removal rate of the hard mask (Continued)

10

| |
|---|
| 20 Photoresist |
| 30-2 Middle Layer |
| 30-1 Middle Layer |
| 110 Hardmask |
| 120 Absorber |
| 130 Capping Layer |
| 140 Multi Layer |
| 150 LTEM |
| 160 Conductive Layer |

101 { layer and a second removal rate of the middle layer, and a ratio of the first removal rate of the hard mask layer to the second removal rate of the middle layer is greater than 5.

20 Claims, 7 Drawing Sheets

(51) Int. Cl.
  *G03F 1/38*          (2012.01)
  *G03F 7/09*          (2006.01)

(56)                References Cited

U.S. PATENT DOCUMENTS

| 8,796,666 | B1 | 8/2014 | Huang et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,310,675 | B2 | 4/2016 | Huang et al. |
| 9,529,268 | B2 | 12/2016 | Chang et al. |
| 9,548,303 | B2 | 1/2017 | Lee et al. |
| 9,588,419 | B2 | 3/2017 | Lu et al. |
| 9,618,837 | B2 | 4/2017 | Lu et al. |
| 9,869,928 | B2 | 1/2018 | Huang et al. |
| 9,869,934 | B2 | 1/2018 | Huang et al. |
| 9,869,939 | B2 | 1/2018 | Yu et al. |
| 9,975,758 | B2 | 5/2018 | Tedeschi et al. |
| 2002/0132171 | A1* | 9/2002 | Levinson ................... G03F 1/32 430/5 |
| 2004/0229136 | A1* | 11/2004 | Kaneko ..................... G03F 1/54 428/428 |
| 2005/0100799 | A1* | 5/2005 | Hagiwara ........... G03F 7/70458 430/394 |
| 2012/0212816 | A1* | 8/2012 | Kim .......................... G02B 1/11 430/323 |
| 2014/0302429 | A1* | 10/2014 | Shoki ......................... G03F 1/84 430/5 |
| 2015/0024305 | A1* | 1/2015 | Lu ............................. G03F 1/52 430/5 |
| 2017/0263444 | A1* | 9/2017 | Shoki ......................... G03F 1/80 |
| 2018/0149962 | A1* | 5/2018 | Kobayashi ................ G03F 1/24 |
| 2019/0101817 | A1 | 4/2019 | Lin |
| 2020/0004133 | A1 | 1/2020 | Hsu et al. |

FOREIGN PATENT DOCUMENTS

| TW | I477927 | B | 3/2015 |
| TW | I652543 | B | 3/2019 |
| TW | I655495 | B | 4/2019 |
| TW | I676076 | B | 11/2019 |
| TW | I592737 | B | 7/2021 |

* cited by examiner

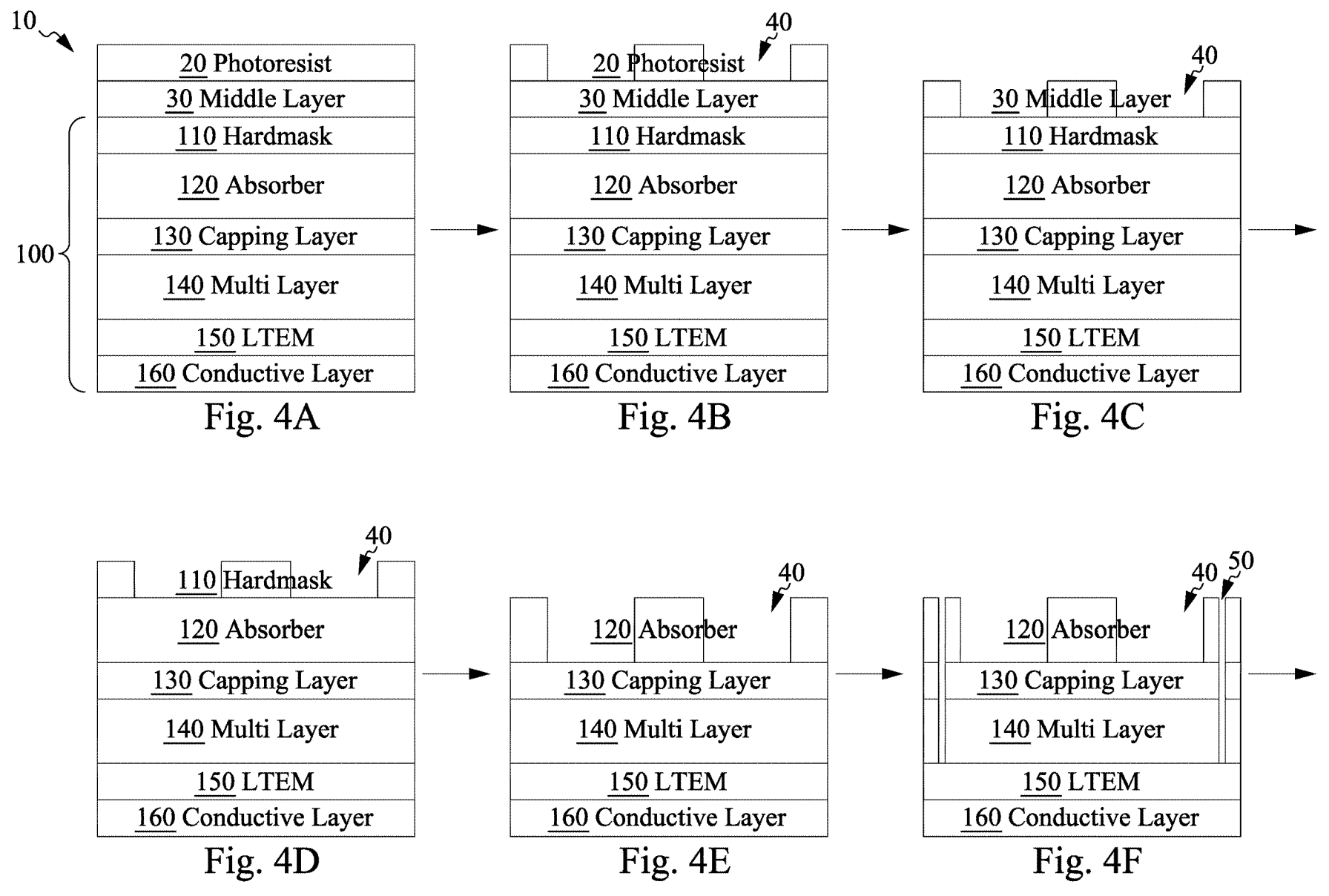

10

100

20 Photoresist

30 Middle Layer

110 Hardmask

120 Absorber

130 Capping Layer

140 Multi Layer

150 LTEM

160 Conductive Layer

20 Photoresist

30 Middle Layer

110 Hardmask

120 Absorber

130 Capping Layer

140 Multi Layer

150 LTEM

160 Conductive Layer

30 Middle Layer

110 Hardmask

120 Absorber

130 Capping Layer

140 Multi Layer

150 LTEM

160 Conductive Layer

110 Hardmask

120 Absorber

130 Capping Layer

140 Multi Layer

150 LTEM

160 Conductive Layer

120 Absorber

130 Capping Layer

140 Multi Layer

150 LTEM

160 Conductive Layer

120 Absorber

130 Capping Layer

140 Multi Layer

150 LTEM

160 Conductive Layer

Fig. 4F

S100

S110 — Providing a hardmask (110) disposed on top of absorber (120), a capping layer (130), and a multilayer (140) that are disposed on a substrate (150)

S120 — Forming a middle layer (30) over the hardmask

S130 — Forming a photoresist (20) over the middle layer

S140 — Patterning the photoresist

S150 — Etching the middle layer through the patterned photoresist

S160 — Etching the hardmask through the patterned middle layer

S170 — Etching the absorber through the patterned hardmask

Fig. 5

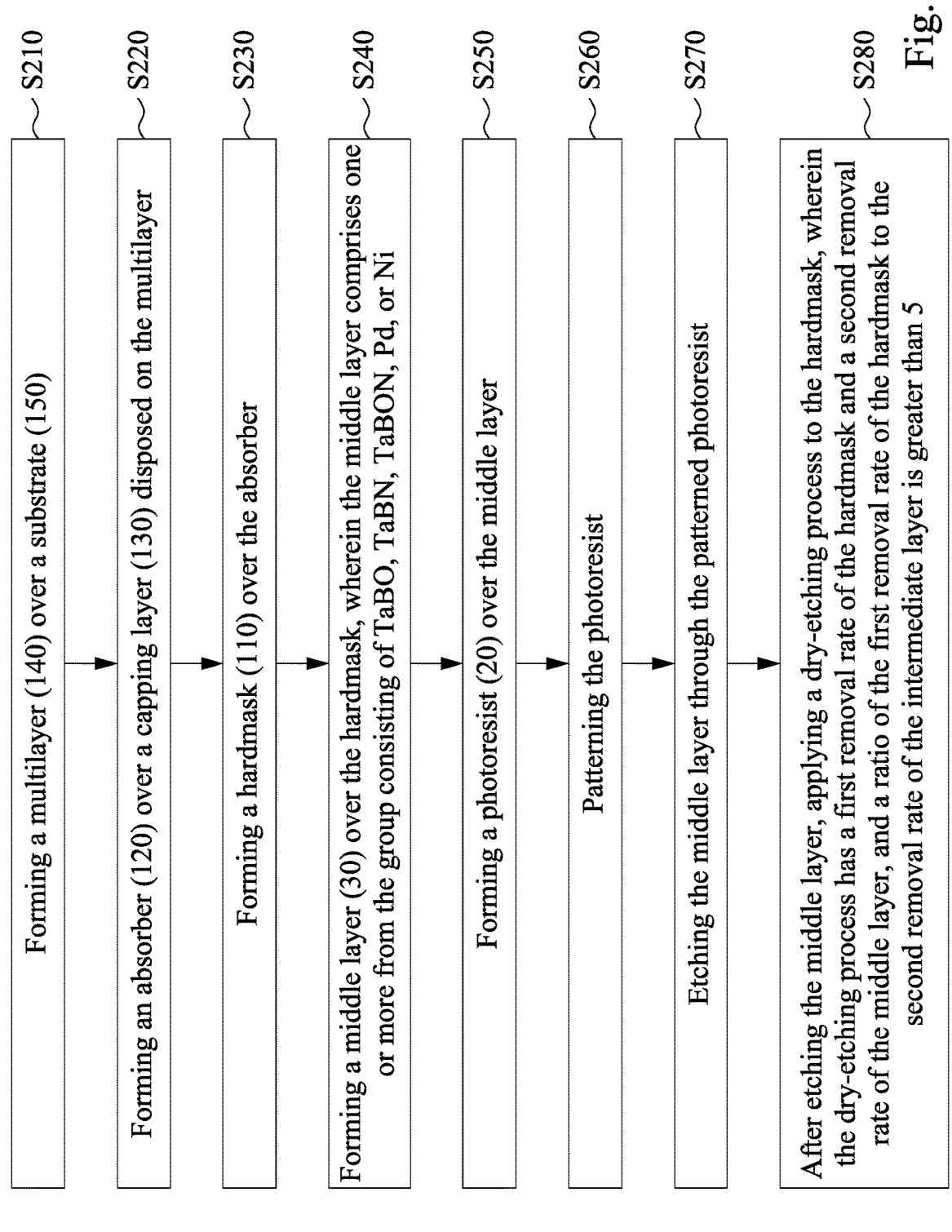

S200

S210 — Forming a multilayer (140) over a substrate (150)

S220 — Forming an absorber (120) over a capping layer (130) disposed on the multilayer S230 — Forming a hardmask (110) over the absorber S240 — Forming a middle layer (30) over the hardmask, wherein the middle layer comprises one or more from the group consisting of TaBO, TaBN, TaBON, Pd, or Ni S250 — Forming a photoresist (20) over the middle layer S260 — Patterning the photoresist S270 — Etching the middle layer through the patterned photoresist S280 — After etching the middle layer, applying a dry-etching process to the hardmask, wherein the dry-etching process has a first removal rate of the hardmask and a second removal rate of the middle layer, and a ratio of the first removal rate of the hardmask to the second removal rate of the intermediate layer is greater than 5

Fig. 6

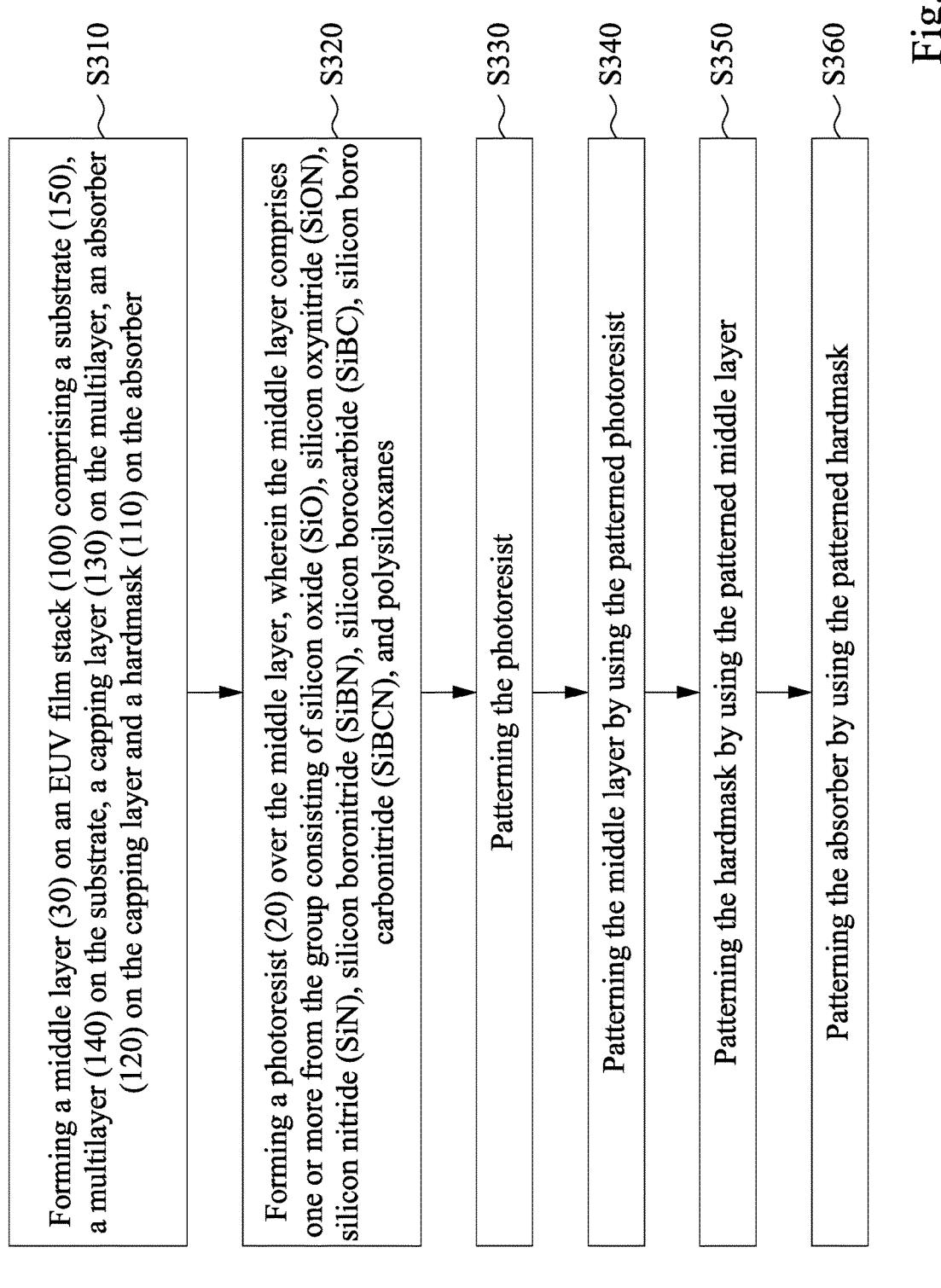

S300

Forming a middle layer (30) on an EUV film stack (100) comprising a substrate (150), a multilayer (140) on the substrate, a capping layer (130) on the multilayer, an absorber (120) on the capping layer and a hardmask (110) on the absorber
S310

Forming a photoresist (20) over the middle layer, wherein the middle layer comprises one or more from the group consisting of silicon oxide (SiO), silicon oxynitride (SiON), silicon nitride (SiN), silicon boronitride (SiBN), silicon borocarbide (SiBC), silicon boro carbonitride (SiBCN), and polysiloxanes
S320

Patterning the photoresist
S330

Patterning the middle layer by using the patterned photoresist
S340

Patterning the hardmask by using the patterned middle layer
S350

Patterning the absorber by using the patterned hardmask
S360

Fig. 7

EXTREME ULTRAVIOLET MASK AND METHOD OF MANUFACTURING THE SAME

RELATED APPLICATION

This application claims priority to U.S. Provisional Patent Application No. 63/014,391 filed on Apr. 23, 2020, the entire content of which is incorporated herein by reference.

BACKGROUND

Photolithography operations are some of the key operations in a semiconductor manufacturing process. Photolithography techniques include ultraviolet lithography, deep ultraviolet lithography, and extreme ultraviolet lithography (EUVL). In such techniques, a photo mask is an important component in photolithography operations. For example, in EUVL, it is critical to fabricate EUV photo masks having a high contrast with a high reflectivity part and a high absorption part. As dimensions shrink to fabricate smaller features, newer integrated circuit technologies require finer patterns with narrower critical dimensions. Therefore, new and improved EUV mask film structures are needed to enhance lithographic resolution and more robust processes are needed for manufacturing such EUV masks.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 4B, 4C, 4D, 4E, and 4F schematically illustrate sequential processing steps in a method of fabricating an EUV photo mask according to various embodiments of the present disclosure.

FIG. 5 shows a flowchart of an example method fabricating an EUV photo mask in accordance with various embodiments of the present disclosure.

FIG. 6 shows a flowchart of another example method of fabricating an EUV photo mask in accordance with various embodiments of the present disclosure.

FIG. 7 shows a flowchart of another example method of fabricating an EUV photo mask in accordance with various embodiments of the present disclosure.

DETAILED DESCRIPTION

Figures 1A, 1B, 1C:
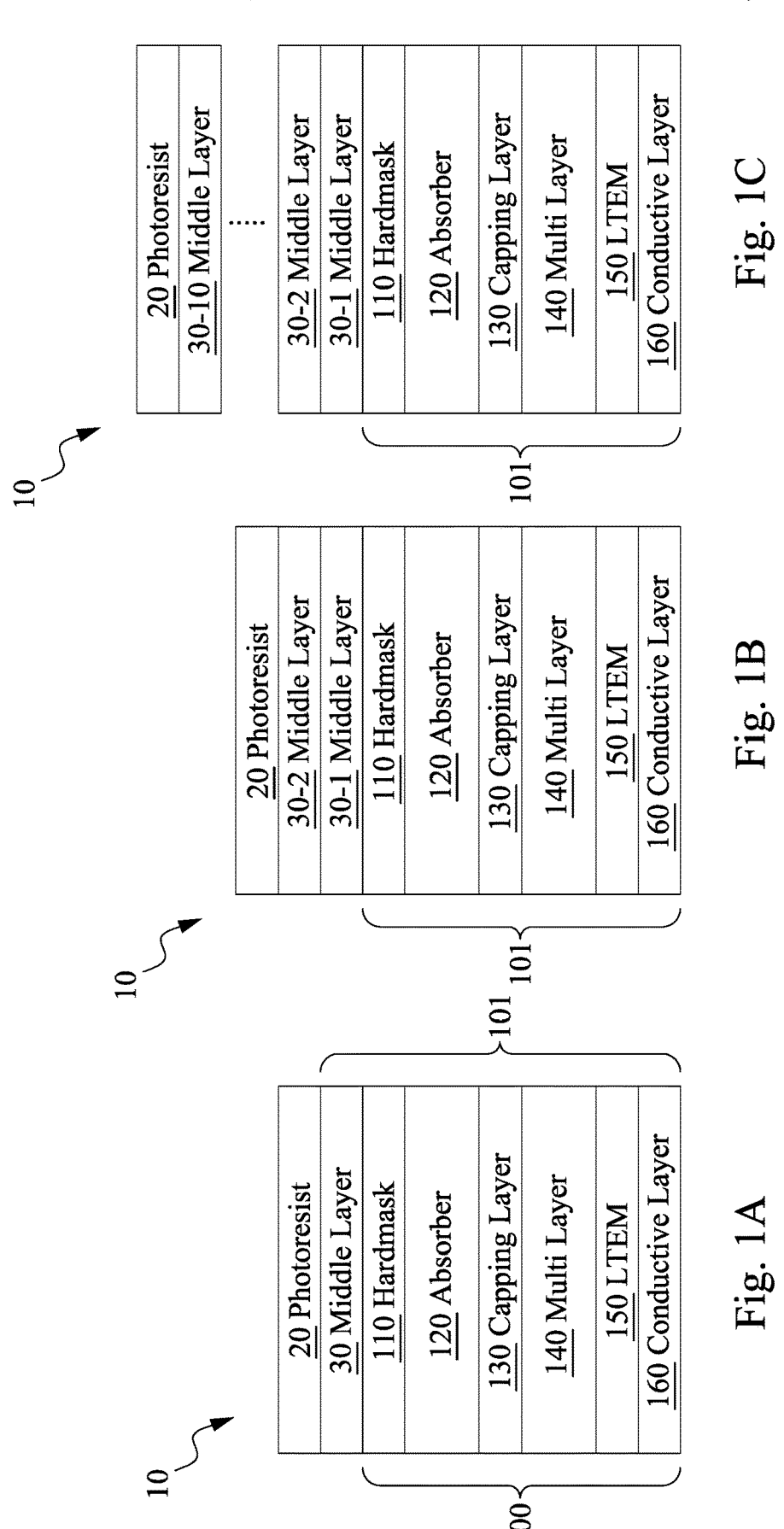
FIGS. 1A, 1B, and 1C show an EUV photo mask structure according to various embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure provide a method of manufacturing an EUV photo mask. The present disclosure provides methods and techniques to enhance lithographic resolution and more robust processes are needed for manufacturing such EUV masks. More specifically, the disclosure relates to a new film structure for fabricating an EUV Mask, which contains a middle layer between photo resist layer and hard mask layer, also referred to herein as "trilayer strategy". This trilayer strategy can be implemented in wafer process in immersion and EUV lithography, where the middle layer is configured to be etch-selective to the top photo resist layer and the underlying hard mask layer. In accordance with various embodiments disclosed herein, a relatively thin photo resist layer can used to transfer patterns to the middle layer in which the etching selectivity of the middle layer can mitigate the corner rounding issue from photo resist layer losses, which increases pattern fidelity. The use of the middle layer enables mitigating conventional issues, such as rounding of corners in the patterns from photo resist layer losses and/or pattern collapses due to high aspect ratio photo resist layer when lateral dimension is much smaller compared to the resist thickness. More specifically, the disclosed methods and techniques enhance patterning resolution by reducing photo resist layer thickness, and enhance pattern fidelity by enhancing etching resistance. The disclosed film scheme (film structure) can be clearly identified in EUV mask blank, and improve current EUV mask fabricating processes and facilitate the development of next generation EUV lithography.

Typically, EUV lithography (EUVL) employs scanners using light in the extreme ultraviolet (EUV) region, having a wavelength of about 1 nm to about 100 nm, for example, 13.5 nm. The mask is a critical component of an EUVL system. Because the optical materials are not transparent to EUV radiation, EUV photo masks are reflective masks. Circuit patterns are formed in an absorber layer disposed over the reflective structure. The absorber has a low EUV reflectivity, for example, less than 3-5%. The present disclosure provides an EUV reflective photo mask having fine patterns with narrow critical dimensions. With the disclosed EUV mask scheme and processes, fine patterns come with high aspect ratio, which translate to better pattern fidelity transferred from original photo resist layer exposure to absorber layers in the EUV mask.

FIGS. 1A, 1B, and 1C show an EUV photo mask structure 10, in accordance with various embodiments of the present disclosure. As illustrated in FIGS. 1A, 1B, and 1C, a desired EUV photo mask with circuit patterns is formed from the EUV photo mask structure 10 that is shown to have a photo resist layer 20 and a middle layer 30 disposed on an EUV photo mask blank 100. As shown in FIG. 1A, the EUV photo mask blank 100 includes a hard mask layer (hardmask) 110, an absorber (absorber layer) 120, a capping layer 130, a (reflective) multilayer 140, a substrate 150 (also referred to herein as low-thermal expansion material (LTEM) 150), and a conductive layer 160, in accordance with various embodiments of the present disclosure. In some embodiments, a modified EUV photo mask blank 100, which is designated as EUV photo mask blank 101, can include the middle layer 30, the hard mask layer 110, the absorber 120, the capping layer 130, the multilayer 140, the substrate 150, and the conductive layer 160. Unless otherwise stated explicitly, the EUV photo mask blank 101 is EUV photo mask blank 100 with the middle layer 30, as illustrated in FIGS. 1A, 1B, and 1C. Accordingly, in some embodiments, the hard mask layer 110 can be designated as a first hard mask layer and the middle layer 30 can be designated as a second hard mask layer if the mask blank is designated as the EUV photo mask blank 101.

In accordance with various embodiments, the method of fabricating a EUV mask begins with the EUV photo mask blank 100, and the EUV photo mask blank 101 if it already has a middle layer disposed on the blank 100. In various embodiments, the middle layer 30 and the photo resist layer 20 are disposed on the EUV photo mask blank 100 to obtain the EUV photo mask structure 10. In accordance with various embodiments, the middle layer 30 is chosen to have etching selectivity to the photo resist layer 20 and the top layer of the EUV photo mask blank 100, which is the hard mask layer 110.

In various embodiments, the photo resist layer 20 contains positive chemically amplified resist (PCAR), negative chemically amplified resist (NCAR), non-chemically amplified resist (Non CAR) photo resist layer, or inorganic photo resist such as Metal photoresist (MePR) or Hydrogen silsesquioxane (HSQ), sensitive to E-beam exposure. The thickness of the photo resist layer 20 ranges from about 2 nm to about 150 nm, from about 5 nm to about 100 nm, from about 7 nm to about 75 nm, from about 10 nm to about 50 nm, or about 70 nm to about 150 nm, inclusive of any thickness values or ranges therebetween.

In various embodiments, the middle layer 30 includes a metal or a metal alloy film that can absorb EUV light. Non-limiting examples of the metal that can be used as the middle layer 30 include, transition metals, such as tantalum (Ta), palladium (Pd), nickel (Ni) and their alloys, such as TaBO, TaBN, and the likes. In various embodiments, the middle layer 30 includes silicon-based materials, such as silicon oxide (SiO), silicon oxynitride (SiON), silicon nitride (SiN), silicon boronitride (SiBN),silicon borocarbide (SiBC), silicon boro carbonitride (SiBCN), or polysiloxanes, etc. The thickness of the middle layer 30 ranges from about 2 nm to about 200 nm, from about 2 nm to about 150 nm, from about 2 nm to about 100 nm, from about 2 nm to about 50 nm, or from about 2 nm to about 30 nm, inclusive of any thickness values or ranges therebetween. In some embodiments, the middle layer 30 is formed by chemical vapor deposition (CVD), plasma-enhanced CVD (PECVD), atomic layer deposition (ALD), physical vapor deposition (PVD) (sputtering), or any other suitable film forming method.

As shown in FIG. 1B, the middle layer 30 includes two middle layers (also referred to herein as sublayers) 30-1 and 30-2 disposed between the photo resist layer 20 and the hard mask layer 110, in accordance with various embodiments. In some embodiments, the middle layer 30-1 (bottom sublayer) may include silicon-containing material and the middle layer 30-2 (top sublayer) may include transition metal-containing material. In some embodiments, the middle layer 30-1 may include transition metal-containing material and the middle layer 30-2 may include silicon-containing material. As shown in FIG. 1C, the middle layer 30 can be a multilayer stack, namely, middle layers (a plurality of sublayers) 30-1, 30-2, . . . , 30-10, having a combination of metal oxides and silicon-based materials with the number of layers ranging from about 2 to about 10, in accordance with various embodiments. In accordance with various embodiments, each of the middle layers 30-1, 30-2, . . . , 30-10, has a thickness ranging from about 1 nm to about 30 nm, from about 2 nm to about 30 nm, from about 2 nm to about 20 nm, or from about 1 nm to about 10 nm, inclusive of any thickness values or ranges therebetween. In some embodiments, the thickness of the multilayered middle layer 30 ranges from about 4 nm to about 200 nm, from about 4 nm to about 150 nm, from about 4 nm to about 100 nm, from about 3 nm to about 50 nm, or from about 3 nm to about 30 nm, inclusive of any thickness values or ranges therebetween. In some embodiments, the multilayered middle layer 30 helps keep high pattern fidelity during hard mask layer etching. In some embodiments, the multilayered middle layer 30 helps reduce photo resist layer loss.

In various embodiments, the middle layer 30 has etching selectivity to the photo resist layer 20 and the hard mask layer 110. For example, a silicon-based middle layer 30 can be etched by mixing gas plasma $CF_4/O_2$ with an etching rate up to 600 A angstrom/s (A/s), where as a hard mask layer 110 comprising CrON may be etched with an etching rate up to 40 A/s. Under similar conditions, the etching rate of the photoresist layer 20 is about 220 A/s to about 240 A/s. Under certain conditions, the etch selectivity of the middle layer 30 to hard mask layer 110 could be up to 80:1, which can help facilitate thinning of the middle layer 30. In various embodiments, the middle layer 30 includes the same material as the absorber layer 120. In various embodiments, the middle layer 30 includes a different material from the absorber layer 120.

In various embodiments, the hard mask layer 110 is configured for pattern transfer function to the absorber layer. The hard mask layer 110 includes a metallic layer, such as Cr or Ta, or their alloys, such as CrON, TaO, TaBO. In various embodiments, the hard mask layer 110 includes silicon, a silicon-based compound (e.g., SiN or SiON). The thickness of the hard mask layer 110 ranges from about 2 nm to about 50 nm, from about 3 nm to about 30 nm, from about 4 nm to about 15 nm, or from about 6 nm to about 10 nm, inclusive of any thickness values or ranges therebetween. In various embodiments, the hard mask layer 110 is formed by chemical vapor deposition, plasma-enhanced chemical vapor deposition, atomic layer deposition, physical vapor deposition (e.g., sputtering), or any other suitable film forming method.

In various embodiments, the thickness ratio of the photo resist layer 20 to the middle layer 30 ranges from about 1:1 to about 75:1, from about 1:1 to about 50:1, from about 1:1 to about 25:1, inclusive of any ratio ranges or ratio values therebetween. In various embodiments, the thickness ratio of the middle layer 30 to the hard mask layer 110 ranges from about 1:1 to about 100:1, from about 1:1 to about 75:1, from about 1:1 to about 50:1, from about 1:1 to about 25:1, inclusive of any ranges or ratio values therebetween. The ratios can be chosen so that the dry etching chemistries are adjusted to have high etching selectivity between photo resist layer 20 to the hard mask layer 110 etching without losing pattern fidelity. In various embodiments, the thickness of the middle layer 30 is chosen so that it does not take extended dry etching stripping, which might damage the opened hard mask layer area. In various embodiments, the thickness of the middle layer 30 is chosen so that it may withstand the plasma during the hard mask layer etching without losing pattern fidelity.

In various embodiments, the absorber 120 includes a metallic layer for absorbing EUV light on EUV exposure tool. The absorber 120 includes a tantalum-based material. In some embodiments of the present disclosure, the absorber 120 has a multilayered structure as described below. In various embodiments, the absorber 120 includes a layer of Ta, Co, Cr, Te, Pt, Pd, Ru, Ir, Ni, and/or their alloys, such as nitrides, carbides, oxides, and/or boron derivatives.

In some embodiments, an antireflective layer (not shown in FIG. 1) is optionally disposed over the absorber 120. The antireflective layer is made of a silicon oxide in some embodiments, and has a thickness of from about 2 nm to about 10 nm. In some embodiments, a TaBO layer having a thickness in a range from about 12 nm to about 18 nm is used as the antireflective layer. In some embodiments, the thickness of the antireflective layer is from about 3 nm to about 6 nm. In some embodiments, the antireflective layer is formed by chemical vapor deposition, plasma-enhanced chemical vapor deposition, atomic layer deposition, physical vapor deposition, or any other suitable film forming method.

In various embodiments, the capping layer 130 includes a metallic layer to protect the underlying multilayer 140 from being etched. In various embodiments, the capping layer 130 is disposed over the multilayer 140 to prevent oxidation of the multilayer 140. In various embodiments, the capping layer 130 includes ruthenium, a ruthenium alloy (e.g., RuB, RuSi or RuNb) or a ruthenium oxide (e.g., $RuO_2$ or RuNbO). The thickness of the capping layer 130 ranges from about 1 nm to about 20 nm, from about 2 nm to about 10 nm, or from about 2 nm to about 4 nm, inclusive of any thickness values or ranges therebetween. In some embodiments, the capping layer 130 has a thickness of 3.5 nm±10%. In some embodiments, the capping layer 130 is formed by chemical vapor deposition, plasma-enhanced chemical vapor deposition, atomic layer deposition, physical vapor deposition (e.g., sputtering), or any other suitable film forming method. In some embodiments, a Si layer is used as the capping layer 130.

In various embodiments, the multilayer 140 includes a film stack containing molybdenum and silicon (also referred to herein as "Mo/Si stack") pairs up to about 60 pairs. In various embodiments, the multilayer 140 includes a film stack containing molybdenum and silicon pairs with a top silicon protecting layer. In some embodiments, the multilayer 140 includes about 30 alternating layer pairs, about 40 alternating layer pairs, about 50 alternating layer pairs, or about 60 alternating layer pairs of each of silicon and molybdenum. In some embodiments, the reflectivity of the multilayer 140 is higher than about 70% for wavelengths of interest, e.g., 13.5 nm. In some embodiments, the silicon and molybdenum layer pairs are formed by chemical vapor deposition (CVD), plasma-enhanced CVD (PECVD), atomic layer deposition (ALD), physical vapor deposition (PVD) (sputtering), or any other suitable film forming method.

In various embodiments, each layer of silicon and molybdenum in the multilayer 140 has a thickness of about 2 nm, about 3 nm, about 4 nm, about 5 nm, about 6 nm, about 7 nm, about 8 nm, about 9 nm, or about 10 nm, inclusive of any thickness values therebetween. In some embodiments, the layers of silicon and molybdenum are about the same thickness. In some embodiments, the layers of silicon and molybdenum are different thicknesses. In some embodiments, the thickness of each silicon layer is about 4 nm and the thickness of each molybdenum layer is about is about 3 nm.

In some embodiments, the multilayer 140 includes alternating molybdenum layers and beryllium layers. In some embodiments, the number of layers in the multilayer 140 is in a range from about 20 to about 100 although any number of layers is allowed as long as sufficient reflectivity is maintained for imaging the target substrate. In some embodiments, the reflectivity is higher than about 70% for wavelengths of interest e.g., 13.5 nm. In some embodiments, the multilayer 140 includes about 30 to about 60 alternating layers of Mo and Be. In other embodiments of the present disclosure, the multilayer 140 includes about 40 to about 50 alternating layers each of Mo and Be.

In various embodiments, the substrate 150 includes a titanium-doped $SiO_2$, a low thermal expansion glass or quartz, such as fused silica or fused quartz. In some embodiments, the substrate 150 transmits light at visible wavelengths, a portion of the infrared wavelengths near the visible spectrum (near-infrared), and a portion of the ultraviolet wavelengths. In some embodiments, the substrate 150 absorbs extreme ultraviolet wavelengths and deep ultraviolet wavelengths near the extreme ultraviolet. In some embodiments, the size of the substrate 150 is 152 mm×152 mm having a thickness of about 0.25 inch.

In various embodiments, the conductive layer 160 includes a metallic layer for mounting EUV masks to a mask holder in EUV exposure tool. In some embodiments, the conductive layer 160 includes a tantalum-based material, such as, tantalum boride (TaB), or other suitable Ta-based conductive material. In some embodiments, the tantalum boride is crystalline. The crystalline tantalum boride includes TaB, $Ta_5B_6$, $Ta_3B_4$ and $TaB_2$. In some embodiments, the tantalum boride is polycrystalline or amorphous. In some embodiments, the conductive layer 160 includes a Cr-based conductive material, such as CrN or CrON. In some embodiments, the sheet resistance of the conductive layer 160 ranges from about 0.1 $\Omega/\square$ to about 20 $\Omega/\square$, from about 0.15 $\Omega/\square$ to about 15 $\Omega/\square$, from about 0.2 $\Omega/\square$ to about 10 $\Omega/\square$, or from about 0.3 $\Omega/\square$ to about 100 $\Omega/\square$, inclusive of any sheet resistance values or ranges therebetween.

In some embodiments, a surface roughness Ra of the conductive layer 160 is equal to or smaller than 0.25 nm. In certain embodiments, the surface roughness Ra of the conductive layer 160 is equal to or more than 0.05 nm. Further, in some embodiments, the flatness of the conductive layer 160 is equal to or less than 50 nm (within the EUV photo mask). In some embodiments, the flatness of the conductive layer 160 is more than 1 nm. A thickness of the conductive layer 160 is in a range from about 50 nm to about 400 nm in some embodiments. In some embodiments, the conductive layer 160 has a thickness of about 50 nm to about 100 nm. In some embodiments, the thickness is in a range from about 65 nm to about 75 nm. In some embodiments, the conductive layer 160 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering, or any other suitable film forming method. In cases of CVD, source gases include $TaCl_5$ and $BCl_3$ in some embodiments.

Figures 2A, 2B, 2C:
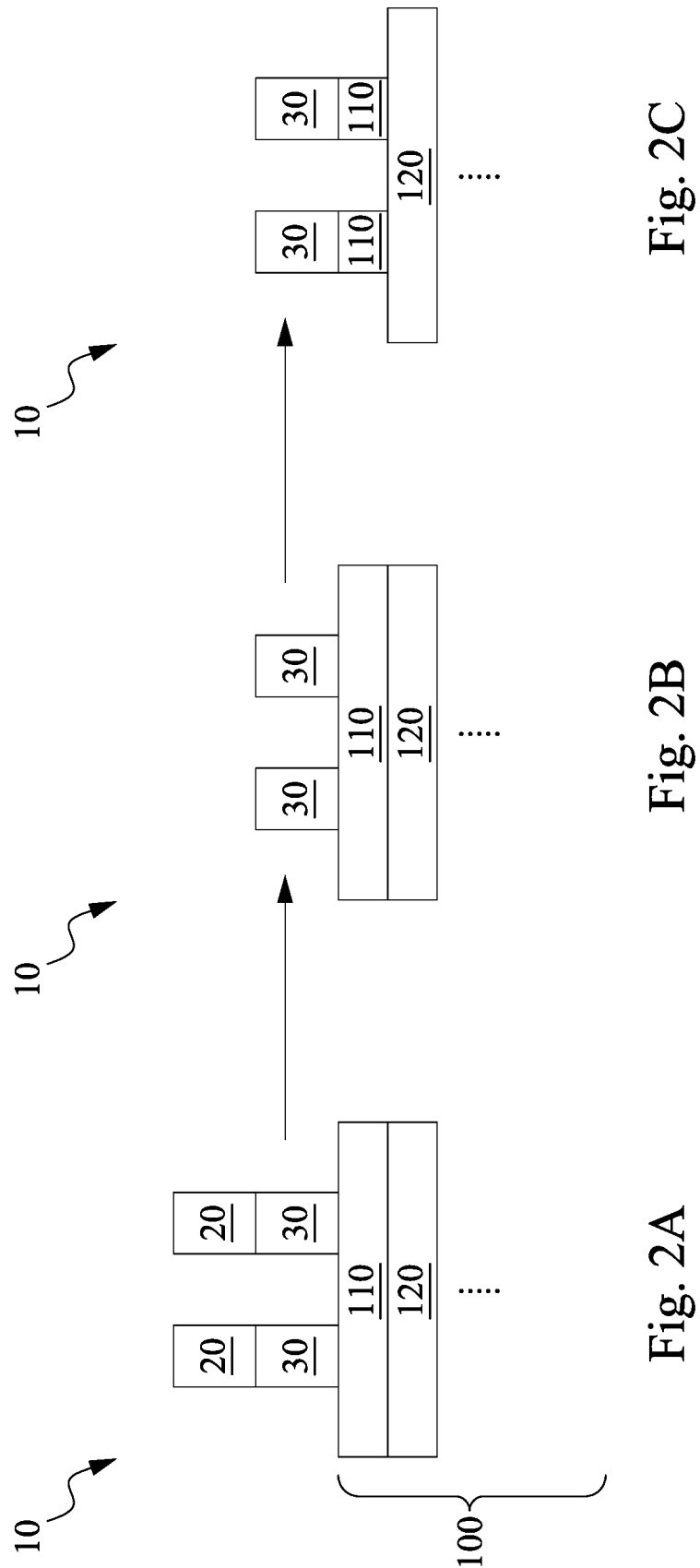
FIGS. 2A, 2B, and 2C schematically illustrate a strategy for fabricating an EUV photo mask according to various embodiments of the present disclosure.

FIGS. 2A, 2B, and 2C schematically illustrate a process strategy for fabricating an EUV photo mask according to various embodiments of the present disclosure. The process strategy includes a trilayer strategy implemented to achieve high pattern fidelity and lithographic resolution.

FIGS. 2A, 2B, and 2C schematically illustrate progression of the process strategy at three example stages of the fabrication, starting with the EUV photo mask structure 10. FIG. 2A illustrates a processing stage of the EUV photo mask structure 10, where the photo resist layer 20 is used as mask to pattern the middle layer 30 that is disposed on the hard mask layer 110 that is disposed on the absorber 120. By using a low-aspect ratio patterns defined by the photo resist layer 20, the middle layer 30 can be formed using the low-aspect ratio photo resist layer 20 as etching mask. Once the patterns are etched in the middle layer 30, the photo resist layer 20 can be removed. FIG. 2B illustrates the stage of the EUV photo mask structure 10 after the photo resist layer 20 is removed from the EUV photo mask structure 10. As shown in FIG. 2B, the middle layer 30 can be used in etching the EUV photo mask blank 100 with high fidelity and resolution. FIG. 2C illustrates the stage of the EUV photo mask structure 10, where the middle layer 30 is used as mask to pattern and etch the EUV photo mask blank 100, or any layer of the EUV photo mask blank 100. As shown in FIG. 1, the EUV photo mask blank 100 refers to the layer stack that includes the hard mask layer 110, the absorber 120, the capping layer 130, the multilayer 140, the substrate 150, and the conductive layer 160, in accordance with various embodiments in the present disclosure.

Figures 3A, 3B, 3C:
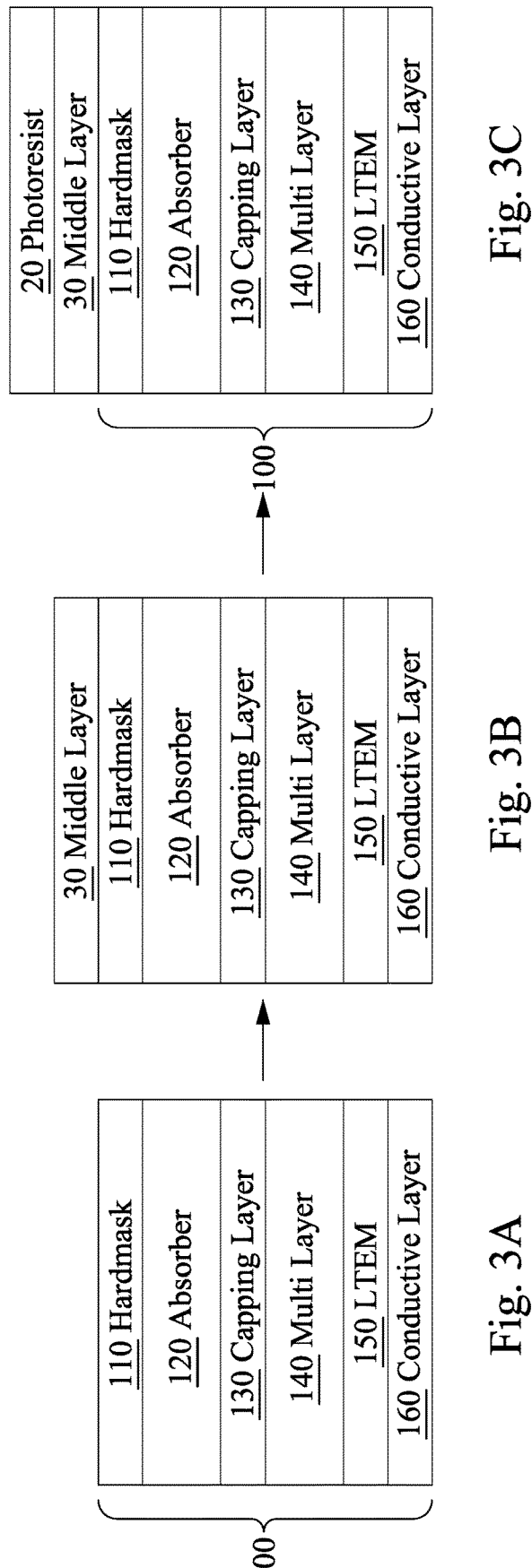
FIGS. 3A, 3B, and 3C schematically illustrate sequential processing steps in a method of fabricating an EUV photo mask according to various embodiments of the present disclosure.

FIGS. 3A, 3B, and 3C schematically illustrate sequential processing steps in a method of fabricating an EUV photo mask according to various embodiments of the present disclosure. FIG. 3A illustrates the EUV photo mask blank 100, which includes the hard mask layer 110, the absorber 120, the capping layer 130, the multilayer 140, the substrate 150, and the conductive layer 160, in accordance with various embodiments in the present disclosure. In some embodiments, the EUV photo mask blank 100 may not include all the layers in the layer stack as shown in FIG. 3A. In some embodiments, the EUV photo mask blank 100 may include one or more additional layers to the layer stack shown in FIG. 3A. The EUV photo mask blank 100 shown in FIG. 3A can be formed via various suitable processing techniques.

FIG. 3B illustrates the stage of the fabrication process where the middle layer 30 is disposed on the EUV photo mask blank 100. The middle layer 30 is described with respect to FIGS. 1A-1C, and therefore will not be described in further detail. As discussed above, the middle layer 30 can be a single layer, or can include two middle layers (sublayers) 30-1 and 30-2, or a multilayer stack having a plurality of sublayers, i.e., the middle layers 30-1, 30-2, . . . , 30-10, as shown and described respectively in FIGS. 1A, 1B, and 1C. In accordance with various embodiments, any of the middle layers, including single or multiple sublayers 30-1, 30-2, . . . , 30-10 may include silicon-containing material or transition metal-containing material. The composition of the middle layers 30-1, 30-2, . . . , 30-10 can be the same or varied so that at least two of the middle layers 30-1, 30-2, . . . , 30-10 can have alternating compositions, thicknesses, or otherwise have differing physical dimensions or chemical compositions. Similarly, as described above, the middle layer 30, including middle layers 30-1, 30-2, . . . , 30-10, can be formed by chemical vapor deposition, plasma-enhanced chemical vapor deposition, atomic layer deposition, physical vapor deposition (e.g., sputtering), or any other suitable film forming method.

FIG. 3C illustrates the stage of the fabrication process where the photo resist layer 20 is disposed on the middle layer 30 that has been disposed on the EUV photo mask blank 100. As described with respect to FIG. 1A, the photo resist layer 20 contains PCAR, NCAR or Non CAR photo resist layer or inorganic photo resist such as Metal photoresist (MePR) or Hydrogen silsesquioxane (HSQ), sensitive to E-beam exposure. In accordance with various embodiments, the thickness of the photo resist layer 20 that is deposited can range from about 2 nm to about 150 nm, from about 5 nm to about 100 nm, from about 7 nm to about 75 nm, from about 10 nm to about 50 nm, or about 70 nm to about 150 nm, inclusive of any thickness values or ranges therebetween.

FIGS. 4A, 4B, 4C, 4D, 4E, and 4F schematically illustrate sequential processing steps in a method of fabricating of an EUV photo mask 10 according to various embodiments of the present disclosure. It is understood that additional operations can be provided before, during, and after processes shown by FIGS. 4A-4F, and some of the operations described below can be replaced or eliminated, for additional embodiments of the method. The order of the operations and/or processes may be interchangeable.

As illustrated in FIG. 4A, the EUV photo mask structure 10 includes the photo resist layer 20 that is formed over the middle layer 30 that has been disposed on the EUV photo mask blank 100. The photo resist layer 20 and the middle layer 30 are disposed on the EUV photo mask blank 100 having the stack of the hard mask layer 110, the absorber 120, the capping layer 130, the multilayer 140, the substrate 150, and the conductive layer 160, in accordance with various embodiments of the present disclosure, e.g., FIGS. 3A-3C. Once the photo resist layer 20 is disposed on the middle layer 30, the photo resist layer 20 is exposed to actinic radiation in a pattern. The selectively exposed photo resist layer 20 is baked and developed to form the pattern in the photo resist layer 20. In some embodiments, the actinic radiation is an electron beam or an ion beam. In some embodiments, a descum step is optionally implemented to remove resist residues in openings.

FIG. 4B illustrates the stage after the photo resist layer 20 has been developed with a pattern 40, which may correspond to a pattern of semiconductor device features for which the EUV photo mask 10 will be used to form in subsequent operations. Once the pattern 40 is formed in the photo resist layer 20, a dry-etching (or any other suitable processing steps) is performed to transfer the pattern 40 in the photo resist layer 20 into the middle layer 30. In accordance with various embodiments, using the photo resist layer 20 as a mask to etch the middle layer 30 helps reduce rounding corner of the photo resist layer 20. In some embodiments, the dry-etching of middle layer 30 can be less reactive to the photo resist layer 20 depending on the dry-etching method being employed. In some embodiments, a high etching selectivity to the photo resist layer 20 is chosen when etching the middle layer 30. When a high etching selectivity is chosen, the photo resist layer 20 is not easily consumed and thus prevent from causing round corner during the dry-etching of the middle layer 30. In some embodiments, there is a reduced amount of corner rounding of photo resist layer 20 during etching the middle layer 30 compared to if the hard mask layer 110 were to be etched directly without using the middle layer 30. In the case where the hard mask layer 110 is directly etched without the use of the middle layer 30, the hard mask layer 110, which may include CrON or Cr with any percentage of oxygen and nitrogen, the hard mask layer 110 can be dry-etched with mixing gas of chlorine-containing gases ($Cl_2$, $BCl_3$, $CCl_4$) and oxygen. In some embodiments, an inert gas can be used during the etching. In some embodiments, the dry-etching of the middle layer 30 can be one of $CF_4$, $CHF_3$, $CH_2F_2$, $CH_3F$ or the combination of these fluorine-containing gases.

In accordance with various embodiments, a thinner layer of the photo resist layer 20 can be used, which prevents collapsing of high aspect ratio features during developing of the photo resist layer 20. In some embodiments, the middle layer 30 can be thinner than the photo resist layer 20 because the etching selectivity of middle layer 30 to the hard mask layer 110 is higher than that of the photo resist layer 20 to the hard mask layer 110. For example, a hard mask layer 110 comprising CrON can be etched by mixing gas plasma $Cl_2/O_2$ with an etching rate up to about 240 angstrom/s (A/s), whereas $SiO_2$ etching rate may be only up to about 3 A/s. Under the similar condition, the etching rate of the photo resist layer 20 is about 220 A/s to about 240 A/s. In some embodiments, the etch selectivity of the middle layer 30 to hard mask layer 110 is about 80:1, which can help facilitate thinning of the middle layer 30.

In accordance with various embodiments, the middle layer 30 can include transition metals and/or their alloys, and silicon-based material. In some embodiments, the materials for the middle layer 30 is chosen in such a way that they have desired etching selectivity to the photo resist layer 20 and the hard mask layer 110. In some embodiments, for the hard mask layer 110 having CrON, the middle layer 30 is chosen to be one or more oxide materials, such as TaBON or silicon-based material, which can be dry-etched with $CF_4$, $CHF_3$, $CH_2F_2$, $CH_3F$ or the combination of these fluorine-containing gases. In some embodiments, for the hard mask layer 110 having oxide materials, such as TaBON or silicon-based material, the middle layer 30 is chosen to be a nitride material, such as CrN or TaN, which can be dry-etched with chlorine-containing gases, such as $Cl_2$, $BCl_3$ and with the option of mixing with oxygen or inert gases.

After completing the etching of the middle layer 30, the photo resist layer 20 can be stripped using a suitable stripping technique, including for example, using organic materials, such as wet etching with sulfuric acid ($H_2SO_4$) and hydrogen peroxide ($H_2O_2$) mixture (SPM) or surface conditioning-1 (SC-1) treatment using aqueous solution of ammonia and hydrogen peroxide after SPM is used as a clean-up step to remove thin organic layers or used for particle removal capability, rinse with organic solvents (PGEE or PGMEA), or dry etching with any oxidizing plasma chemistries ($O_2$, CO, $CO_2$, $H_2O$ or the combination of these oxygen-containing gases) or any reducing plasma chemistries ($N_2$, $H_2$, $NH_3$, $N_2H_4$ or the combination of these hydrogen and nitrogen gases). In some embodiments, stripping of the photo resist layer 20 can be omitted until the etching of the hard mask layer 110 is complete.

FIG. 4C illustrates the stage after the middle layer 30 has been etched (or otherwise formed) with the pattern 40. Once the pattern 40 has been transferred into the middle layer 30, the patterned middle layer 30 is used to form the pattern 40 in the hard mask layer 110 of the EUV photo mask blank 100. In accordance with various embodiments, the etching of the hard mask layer 110 can be accomplished by dry-etching with mixing gas of chlorine-containing gases ($Cl_2$, $BCl_3$, and/or $CCl_4$) and oxygen for the hard mask layer 110 that is made of CrON or Cr with any percentage of oxygen and nitrogen. In some embodiments, an inert gas can be used during the etching. In some embodiments, the etching of the hard mask layer 110 can be accomplished by dry-etching with $CF_4$, $CHF_3$, $CH_2F_2$, $CH_3F$ or the combination of these fluorine-containing gases for the hard mask layer 110 that is made of metal oxides or silicon-based material.

After completing the etching of the hard mask layer 110, the middle layer 30 can be removed by over-etching of such layers with its reactive plasma chemistries. In some embodiments, the over-etching can be completed by dry-etching with or without physical bombardment. In some embodiments, metal oxides or silicon-based materials can be over-etched with $CF_4$, $CHF_3$, $CH_2F_2$, $CH_3F$ or the combination of these fluorine-containing gases. In some embodiments, nitride materials such as CrN or TaN, which can be over-etched with chlorine-containing gases such as $Cl_2$, $BCl_3$. In some embodiments, mixing with oxygen or an inert gas can be used during the etching.

In accordance with various embodiments, the plasma chemistries have to be chosen in a way that it is highly selective to etch the hard mask layer 110 with pattern-transferred middle layer 30. In other words, the etching rate of CrON of the hard mask layer 110 can be modulated by tuning the gas ratio of $Cl_2$ and $O_2$, which would change the etching rate of the middle layer 30. In some embodiments, the etching rate ratio of the hard mask layer 110 to the middle layer 30 is about 10:1 or higher.

In some embodiments, particularly for instances where the stripping of the photo resist layer 20 is omitted until the etching of the hard mask layer 110 is completed, the stripping of the photo resist layer 20 can be done by any conventional stripping method for organic materials, such as wet etching with SPM or SC1, rinse with organic solvents (PGEE or PGMEA), or dry etching with any oxidizing plasma chemistries ($O_2$, CO, $CO_2$, $H_2O$ or the combination of these oxygen-containing gases) or any reducing plasma chemistries ($N_2$, $H_2$, $NH_3$, $N_2H_4$ or the combination of these hydrogen and nitrogen gases). In these embodiments, oxidizing or reducing dry-etching methods may be used to selectively remove or strip the photo resist layer 20 since these etching methods may not be reactive to the middle layer 30.

FIG. 4D illustrates the stage after the hard mask layer 110 has been etched (or otherwise formed) with the pattern 40. Once the pattern 40 has been transferred into the hard mask layer 110, forming the pattern 40 in the absorber 120 is accomplished by dry-etching the exposed portions of the pattern 40 in the absorber 120 by using the patterned hard mask layer 110 as an etch mask. The dry-etching (or any suitable wet-etching) can be performed to remove the exposed portions in the absorber layer 120 to form the pattern 40 in the absorber 120. Once the pattern 40 has been transferred to the absorber 120, the residual portions of the hard mask layer 110 can be removed by over-etching of such layers with its reactive plasma chemistries. In some embodiments, the over-etching can be completed by dry-etching with or without physical bombardment. In some embodiments, metal oxides or silicon-based materials can be over-etched with $CF_4$, $CHF_3$, $CH_2F_2$, $CH_3F$ or the combination of these fluorine-containing gases. In some embodiments, nitride materials such as CrN or TaN, which can be over-etched with chlorine-containing gases such as $Cl_2$, $BCl_3$. In some embodiments, mixing with oxygen or an inert gas can be used during the etching.

FIG. 4E illustrates the stage after the absorber 120 has been etched (or otherwise formed) with the pattern 40. Once the pattern 40 has been transferred into the absorber 120, additional etching into the capping layer 130 or the multi-layer 140 can be performed. In some embodiments, another pattern 50 can be transferred into the EUV photo mask 10, by repeating another set of suitable processing steps, for example, by using another (second) photo resist layer to form a pattern and use it as an etch mask to perform etching (dry or wet etching) into the EUV photo mask 10. In accordance with various embodiments, the pattern 50 defines a black border pattern of the EUV photo mask 10.

FIG. 4F illustrates the stage after the pattern 50 has been transferred into the EUV photo mask 10. As shown in FIG. 4F, the pattern 50 is transferred into the capping layer 130, and the multilayer 140. Once pattern transfer of the pattern 50 is completed, the second photo resist layer can be removed by a suitable photo resist layer stripper to expose the upper surface of the absorber 120, which has both patterns 40 and 50 defined in the absorber 120. The pattern 50 in the absorber 120, capping layer 130, and the multilayer 140 defines a black border of the EUV photo mask 10, in some embodiments of the disclosure. After removal of the second photo resist layer, the EUV photo mask 10 undergoes a cleaning operation, inspection, and the EUV photo mask 10 is repaired as necessary, to provide a finished EUV photo mask 10.

FIG. 5 shows a flowchart of a method S100 of fabricating an EUV photo mask in accordance with various embodiments of the present disclosure. In accordance with various embodiments, the method S100 includes providing a hard mask layer disposed on top of absorber, a capping layer, and a multilayer that are disposed on a substrate, at step S110. In some embodiments, the hard mask layer includes a metallic layer, such as Cr or Ta, or their alloys, such as, CrON, TaB, TaO, TaBO or TaBN, or a silicon-based compound (e.g., SiN or SiON). The thickness of the hard mask layer ranges from about 2 nm to about 50 nm, from about 3 nm to about 30 nm, from about 4 nm to about 15 nm, or from about 6 nm to about 10 nm. In various embodiments, the hard mask layer is formed by chemical vapor deposition, plasma-enhanced chemical vapor deposition, atomic layer deposition, physical vapor deposition (e.g., sputtering), or any other suitable film forming method. In some embodiments, the absorber includes a metallic layer for absorbing EUV light on EUV exposure tool. The absorber includes a tantalum-based material. In some embodiments of the present disclosure, the absorber has a multilayered structure as described below. In various embodiments, the absorber includes a layer of Ta, Co, Cr, Te, Pt, Pd, Ru, Ir, Ni, and/or their alloys, such as nitrides, carbides, oxides, and/or boron derivatives. In some embodiments, the capping layer includes a metallic layer, such as for example, but not limited to ruthenium, a ruthenium alloy (e.g., RuB, RuSi or RuNb) or a ruthenium oxide (e.g., $RuO_2$ or RuNbO). The thickness of the capping layer ranges from about 1 nm to about 20 nm, from about 2 nm to about 10 nm, or from about 2 nm to about 4 nm, inclusive of any thickness values or ranges therebetween. In some embodiments, the multilayer includes a film stack containing molybdenum and silicon pairs that includes about 30 alternating layer pairs, about 40 alternating layer pairs, about 50 alternating layer pairs, or about 60 alternating layer pairs of each of silicon and molybdenum. In some embodiments, the multilayer comprises a plurality of molybdenum and silicon layer pairs up to 50 pairs, with a top silicon protecting layer. In some embodiments, the reflectivity of the multi-layer is higher than about 70% for wavelengths of interest, e.g., 13.5 nm. In some embodiments, the substrate includes a titanium-doped $SiO_2$, a low thermal expansion glass or quartz, such as fused silica or fused quartz. In some embodiments, the substrate transmits light at visible wavelengths, a portion of the infrared wavelengths near the visible spectrum (near-infrared), and a portion of the ultraviolet wavelengths. In some embodiments, the substrate absorbs extreme ultra-violet wavelengths and deep ultraviolet wavelengths near the extreme ultraviolet.

The method S100 includes forming a middle layer over the hard mask layer, at step S120. In some embodiments, the middle layer has a thickness ranging from 2 nm to 200 nm. In some embodiments, the thickness of the middle layer ranges from about 2 nm to about 150 nm, from about 2 nm to about 100 nm, from about 2 nm to about 50 nm, or from about 2 nm to about 30 nm. In some embodiments, the middle layer comprises one or more from the group consisting of TaBO, TaBN, TaBON, Pd, Ni, silicon oxide (SiO), silicon oxynitride (SiON), silicon nitride (SiN), silicon boronitride (SiBN), silicon borocarbide (SiBC), silicon boro carbonitride (SiBCN), or polysiloxanes. In some embodiments, the middle layer comprises a top sublayer and a bottom sublayer, wherein the top sublayer comprises a silicon-containing material, and the bottom sublayer comprises a transition metal-containing material, or vice versa. In some embodiments, the middle layer comprises a plurality of sublayers, wherein at least one of the sublayers comprises a metal-containing material and at least another of the sublayers comprises a silicon-containing material. In some embodiments, the multiple middle layers can be etched by using different ratios of mixing gases, for example, chlorine-containing, fluorine-containing and oxy-gen-containing gases, with the options of adding inert carrier gases, such as He or Ar. Under some conditions, the multiple middle layers may facilitate fine critical dimension control during etching.

The method S100 includes forming a photo resist layer over the middle layer, at step S130. In some embodiments, the photo resist layer includes PCAR, NCAR or Non CAR photo resist layer, sensitive to E-beam exposure. In some embodiments, the thickness of the photo resist layer 20 ranges from about 2 nm to about 120 nm, from about 5 nm to about 100 nm, from about 7 nm to about 75 nm, from about 10 nm to about 50 nm, or about 70 nm to about 120 nm.

The method S100 includes patterning the photo resist layer, at step S140. In some embodiments, patterning the photo resist layer includes exposing the photo resist layer to actinic radiation after forming a pattern via an electron beam or an ion beam. After exposure to actinic radiation, the exposed photo resist layer is baked and developed to form the pattern in the photo resist layer. Once the photo resist layer 20 has the pattern in the photo resist layer, the patterned photo resist layer can be used to form the same pattern in the layer below, e.g., the middle layer, in the fabrication process of the mask.

The method S100 includes etching the middle layer through the patterned photo resist layer, at step S150. In some embodiments, the etching includes a dry-etching (or any other suitable processing steps) that can be performed to transfer the pattern in the photo resist layer into the middle layer. In some embodiments, using the photo resist layer as a mask to etch the middle layer reduces rounding corner of the photo resist layer. In some embodiments, a high etching selectivity to the photo resist layer is chosen when etching the middle layer. When a high etching selectivity is chosen, the photo resist layer is not easily consumed and thus prevent from causing round corner during the dry-etching of the middle layer. In some embodiments, the dry-etching of the middle layer can be one of $CF_4$, $CHF_3$, $CH_2F_2$, $CH_3F$ or the combination of these fluorine-containing gases.

The method S100 includes etching the hard mask layer through the patterned middle layer, at step S160. In accordance with various embodiments, the etching of the hard mask layer can be performed by dry-etching with mixing gas of chlorine-containing gases ($Cl_2$, $BCl_3$, $CCl_4$) and oxygen for the hard mask layer that is made of CrON or Cr with any percentage of oxygen and nitrogen. In some embodiments, an inert gas can be used during the etching. In some embodiments, the etching of the hard mask layer can be performed by dry-etching with $CF_4$, $CHF_3$, $CH_2F_2$, $CH_3F$ or the combination of these fluorine-containing gases for the hard mask layer that is made of metal oxides or silicon-based material. In some embodiments, an inert gas can be used during the etching. In some embodiments, the hard mask layer comprising CrON can be etched by mixing gas plasma $Cl_2/O_2$ with an etching rate up to about 240 A/s.

The method S100 includes and etching the absorber through the patterned hard mask layer, at step S170. In some embodiments, etching the hard mask layer through the patterned middle layer includes a dry-etching process that has a first removal rate of the hard mask layer and a second removal rate of the middle layer, and a ratio of the first removal rate of the hard mask layer to the second removal rate of the middle layer is greater than 5.

In some embodiments, the absorber comprises tantalum, or one or more from the group consisting of Ta, Co, Cr, Te, Pt, Pd, Ru, Ir, Ni and/or their alloys, such as nitrides, carbides, oxides, and/or boron derivatives. In some embodiments, the hard mask layer comprises CrON and has a thickness between 2 nm to 15 nm, and/or the capping layer comprises ruthenium.

FIG. 6 shows a flowchart of a method S200 of fabricating an EUV photo mask in accordance with various embodiments of the present disclosure. The method S200 includes forming a multilayer over a substrate, at step S210. In some embodiments, the multilayer includes a film stack containing molybdenum and silicon pairs that includes about 30 alternating layer pairs, about 40 alternating layer pairs, about 50 alternating layer pairs, or about 60 alternating layer pairs of each of silicon and molybdenum. In some embodiments, the multilayer comprises a plurality of molybdenum and silicon layer pairs up to 50 pairs, with a top silicon protecting layer. In some embodiments, the reflectivity of the multilayer is higher than about 70% for wavelengths of interest, e.g., 13.5 nm. In various embodiments, each layer of silicon and molybdenum in the multilayer has a thickness of about 2 nm, about 3 nm, about 4 nm, about 5 nm, about 6 nm, about 7 nm, about 8 nm, about 9 nm, or about 10 nm. In some embodiments, the layers of silicon and molybdenum are about the same thickness. In some embodiments, the layers of silicon and molybdenum are different thicknesses. In some embodiments, the thickness of each silicon layer is about 4 nm and the thickness of each molybdenum layer is about is about 3 nm.

In some embodiments, the multilayer includes alternating molybdenum layers and beryllium layers. In some embodiments, the number of layers in the multilayer is in a range from about 20 to about 100 although any number of layers is allowed as long as sufficient reflectivity is maintained for imaging the target substrate. In some embodiments, the reflectivity is higher than about 70% for wavelengths of interest e.g., 13.5 nm. In some embodiments, the multilayer includes about 30 to about 60 alternating layers of Mo and Be. In other embodiments of the present disclosure, the multilayer 140 includes about 40 to about 50 alternating layers each of Mo and Be. In some embodiments, the silicon and molybdenum layer pairs and/or the silicon and beryllium pairs are formed by chemical vapor deposition (CVD), plasma-enhanced CVD (PECVD), atomic layer deposition (ALD), physical vapor deposition (PVD) (sputtering), or any other suitable film forming method.

The method S200 includes forming an absorber over a capping layer disposed on the multilayer, at step S220. The method S200 includes forming a hard mask layer over the absorber, at step S230. The method S200 also includes forming a middle layer over the hard mask layer, at step S240. In accordance with various embodiments, the middle layer comprises one or more from the group consisting of TaBO, TaBN, TaB ON, Pd, or Ni. In some embodiments, the middle layer comprises a plurality of sublayers, wherein at least one of the sublayers comprises a metal-containing material and at least another of the sublayers comprises a silicon-containing material. In some embodiments, the plurality of sublayers comprises a first sublayer comprising a silicon-containing material, and a second sublayer comprising a transition metal-containing material, wherein the first and second sublayers are an alternating pair.

The method S200 also includes forming a photo resist layer over the middle layer, at step S250. The method S200 includes patterning the photo resist layer, at step S260. The method S200 includes etching the middle layer through the patterned photo resist layer, at step S270.

The method S200 includes after etching the middle layer, applying a dry-etching process to the hard mask layer, at step S280. The dry-etching process has a first removal rate of the hard mask layer and a second removal rate of the middle layer, and a ratio of the first removal rate of the hard mask layer to the second removal rate of the middle layer is greater than 5. In some embodiments, each of the sublayers has a thickness ranging from 2 nm to 30 nm, and/or the middle layer has a thickness ranging from 4 nm to 200 nm. In some embodiments, the middle layer comprises one or more from the group consisting of TaBO, TaBN, TaBON, Pd, Ni, silicon oxide (SiO), silicon oxynitride (SiON), silicon nitride (SiN), silicon boronitride (SiBN), silicon borocarbide (SiBC), silicon boro carbonitride (SiBCN), or polysiloxanes. In some embodiments, the absorber comprises tantalum, or one or more from the group consisting of Ta, Co, Cr, Te, Pt, Pd, Ru, Ir, Ni and/or their alloys, such as nitrides, carbides, oxides, and/or boron derivatives. In some embodiments, the hard mask layer comprises CrON and has a thickness between 2 nm to 15 nm, and/or the capping layer comprises ruthenium, and the multilayer comprises a plurality of molybdenum and silicon layer pairs up to 50 pairs. In some embodiments, the method further includes etching the absorber through the patterned hard mask layer.

FIG. 7 shows a flowchart of a method S300 of fabricating an EUV photo mask in accordance with various embodiments of the present disclosure. The method S300 includes forming a middle layer on an EUV film stack comprising a substrate, a multilayer on the substrate, a capping layer on the multilayer, an absorber on the capping layer and a hard mask layer on the absorber, at step S310. The method S300 includes forming a photo resist layer over the middle layer, wherein the middle layer comprises one or more from the group consisting of silicon oxide (SiO), silicon oxynitride (SiON), silicon nitride (SiN), silicon boronitride (SiBN), silicon borocarbide (SiBC), silicon boro carbonitride (SiBCN), or polysiloxanes, at step S320. The method S300 also includes patterning the photo resist layer, at step S330. The method S300 includes patterning the middle layer by using the patterned photo resist layer, at step S340. The method S300 includes patterning the hard mask layer by using the patterned middle layer, at step S350. The method S300 includes patterning the absorber by using the patterned hard mask layer at step S360. In some embodiments, patterning the hard mask layer includes etching the hard mask layer via a dry-etching process using to the patterned middle layer as a mask, wherein the dry-etching process has a first removal rate of the hard mask layer and a second removal rate of the middle layer, and a ratio of the first removal rate of the hard mask layer to the second removal rate of the middle layer is greater than about 5. In some embodiments, the middle layer comprises a plurality of sublayers, wherein at least one of the sublayers comprises a metal-containing material and at least another of the sublayers comprises a silicon-containing material. In some embodiments, each of the sublayers has a thickness ranging from 2 nm to 30 nm, and/or the middle layer has a thickness ranging from 4 nm to 200 nm. In some embodiments, the absorber comprises tantalum, or one or more from the group consisting of Ta, Co, Cr, Te, Pt, Pd, Ru, Ir, Ni and/or their alloys, such as nitrides, carbides, oxides, and/or boron derivatives.

In the present disclosure, a method of fabricating an EUV photo mask by using a middle layer to enhance etch selectivity between the hard mask layer and the photo resist layer is implemented. The present disclosure provides methods and techniques to enhance lithographic resolution and more robust processes that are needed for manufacturing such EUV masks. The disclosed fabrication strategy can be used in conjunction with the disclosed film structure for EUV mask fabrication, thereby improving current EUV mask fabricating processes and facilitate the development of next generation EUV lithography. It will be understood that not all advantages have been necessarily discussed herein, no particular advantage is required for all embodiments or examples, and other embodiments or examples may offer different advantages.

In accordance with one aspect of the present disclosure, a method of forming a mask is provided. The method includes providing a hard mask layer disposed on top of absorber, a capping layer, and a multilayer that are disposed on a substrate. The method includes forming a middle layer over the hard mask layer, forming a photo resist layer over the middle layer, patterning the photo resist layer, etching the middle layer through the patterned photo resist layer, etching the hard mask layer through the patterned middle layer, and etching the absorber through the patterned hard mask layer. In some embodiments, etching the hard mask layer through the patterned middle layer includes a dry-etching process that has a first removal rate of the hard mask layer and a second removal rate of the middle layer, and a ratio of the first removal rate of the hard mask layer to the second removal rate of the middle layer is greater than 5. In some embodiments, the middle layer has a thickness ranging from 2 nm to 200 nm. In some embodiments, the middle layer comprises one or more from the group consisting of TaBO, TaBN, TaBON, Pd, Ni, silicon oxide (SiO), silicon oxynitride (SiON), silicon nitride (SiN), silicon boronitride (SiBN), silicon borocarbide (SiBC), silicon boro carbonitride (SiBCN), or polysiloxanes. In some embodiments, the middle layer comprises a top sublayer and a bottom sublayer, wherein the top sublayer comprises a silicon-containing material, and the bottom sublayer comprises a transition metal-containing material, or vice versa. In some embodiments, the middle layer comprises a plurality of sublayers, wherein at least one of the sublayers comprises a metal-containing material and at least another of the sublayers comprises a silicon-containing material. In some embodiments, the absorber comprises tantalum, or one or more from the group consisting of Ta, Co, Cr, Te, Pt, Pd, Ru, Ir, Ni and/or their alloys, including nitrides, carbides, oxides, and/or boron derivatives. In some embodiments, the hard mask layer comprises CrON and has a thickness between 2 nm to 15 nm, and/or the capping layer comprises ruthenium. In some embodiments, the multilayer comprises a plurality of molybdenum and silicon layer pairs up to 50 pairs, with a top silicon protecting layer.

In accordance with one aspect of the present disclosure, a method of forming a mask is provided. The method includes forming a multilayer over a substrate, forming an absorber over a capping layer disposed on the multilayer, forming a hard mask layer over the absorber, forming a middle layer over the hard mask layer. The middle layer comprises a plurality of sublayers, wherein at least one of the sublayers comprises a metal-containing material and at least another of the sublayers comprises a silicon-containing material. The method also includes forming a photo resist layer over the middle layer, patterning the photo resist layer, etching the middle layer through the patterned photo resist layer, and after etching the middle layer, applying a dry-etching process to the hard mask layer. The dry-etching process has a first removal rate of the hard mask layer and a second removal rate of the middle layer, and a ratio of the first removal rate of the hard mask layer to the second removal rate of the middle layer is greater than 5. In some embodiments, the plurality of sublayers comprises a first sublayer comprising a silicon-containing material, and a second sublayer comprising a transition metal-containing material, wherein the first and second sublayers are an alternating pair. In some embodiments, each of the sublayers has a thickness ranging from 2 nm to 30 nm, and/or the middle layer has a thickness ranging from 4 nm to 200 nm. In some embodiments, the middle layer comprises one or more from the group consisting of TaBO, TaBN, TaBON, Pd, Ni, silicon oxide (SiO), silicon oxynitride (SiON), silicon nitride (SiN), silicon boronitride (SiBN), silicon borocarbide (SiBC), silicon boro carbonitride (SiBCN), or polysiloxanes. In some embodiments, the absorber comprises tantalum, or one or more from the group consisting of Ta, Co, Cr, Te, Pt, Pd, Ru, Ir, Ni and/or their alloys, including nitrides, carbides, oxides, and/or boron derivatives. In some embodiments, the hard mask layer comprises CrON and has a thickness between 2 nm to 15 nm, and/or the capping layer comprises ruthenium, and the multilayer comprises a plurality of molybdenum and silicon layer pairs up to 50 pairs. In some embodiments, the method further includes etching the absorber through the patterned hard mask layer.

In accordance with one aspect of the present disclosure, a method of forming a mask is provided. The method includes forming a middle layer on an EUV film stack comprising a substrate, a multilayer on the substrate, a capping layer on the multilayer, an absorber on the capping layer and a hard mask layer on the absorber. The method includes forming a photo resist layer over the middle layer, wherein the middle layer comprises one or more from the group consisting of TaBO, TaBN, TaBON, Pd, Ni, silicon oxide (SiO), silicon oxynitride (SiON), silicon nitride (SiN), silicon boronitride (SiBN), silicon borocarbide (SiBC), silicon boro carbonitride (SiBCN), or polysiloxanes. The method also includes patterning the photo resist layer, patterning the middle layer by using the patterned photo resist layer, patterning the hard mask layer by using the patterned middle layer, and patterning the absorber by using the patterned hard mask layer. In some embodiments, patterning the hard mask layer includes etching the hard mask layer via a dry-etching process using to the patterned middle layer as a mask, wherein the dry-etching process has a first removal rate of the hard mask layer and a second removal rate of the middle layer, and a ratio of the first removal rate of the hard mask layer to the second removal rate of the middle layer is greater than about 5. In some embodiments, the middle layer comprises a plurality of sublayers, wherein at least one of the sublayers comprises a metal-containing material and at least another of the sublayers comprises a silicon-containing material. In some embodiments, each of the sublayers has a thickness ranging from 2 nm to 30 nm, and/or the middle layer has a thickness ranging from 4 nm to 200 nm.

In accordance with one aspect of the present disclosure, an EUV photo mask blank is provided. The EUV photo mask blank includes a multilayer disposed over a substrate, a capping layer disposed over the multilayer, an absorber disposed over the capping layer, a hard mask layer disposed over the absorber; and a middle layer disposed over the hard mask layer. The middle layer is higher etching selectivity to a photo resist than the hard mask layer. In some embodiments, the middle layer has a thickness ranging from 2 nm to 200 nm. In some embodiments, the middle layer comprises one or more from the group consisting of TaBO, TaBN, TaBON, Pd, or Ni. In some embodiments, the middle layer comprises one or more from the group consisting of silicon oxide (SiO), silicon oxynitride (SiON), silicon nitride (SiN), silicon boronitride (SiBN), silicon borocarbide (SiBC), silicon boro carbonitride (SiBCN), or polysiloxanes. In some embodiments, the middle layer comprises a top sublayer and a bottom sublayer, wherein the top sublayer comprises a silicon-containing material, and the bottom sublayer comprises a transition metal-containing material, or vice versa. In some embodiments, the middle layer comprises a plurality of sublayers, wherein at least one of the sublayers comprises a metal-containing material and at least another of the sublayers comprises a silicon-containing material. In some embodiments, the absorber comprises tantalum, or one or more from the group consisting of TaBO, TaBN, TaB ON, Pd, Ni, silicon oxide (SiO), silicon oxynitride (SiON), silicon nitride (SiN), silicon boronitride (SiBN), silicon borocarbide (SiBC), silicon boro carbonitride (SiBCN), or polysiloxanes. In some embodiments, the hard mask layer comprises CrON and has a thickness between 2 nm to 15 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a mask, the method comprising:
providing a hard mask layer directly on an absorber layer, wherein a reflective multilayer is disposed on a substrate, a capping layer is disposed on the reflective multilayer and the absorber layer is disposed directly on the capping layer;
forming a middle layer over the hard mask layer;
forming a photo resist layer over the middle layer;
patterning the photo resist layer;
etching the middle layer through the patterned photo resist layer to generate a patterned middle layer;
removing remaining photo resist layer after etching the middle layer;
etching the hard mask layer through the patterned middle layer to generate a patterned hard mask after removing the remaining photo resist layer; and
etching the absorber layer using the patterned hard mask layer as an etching mask,
wherein the patterned middle layer is fully removed during or after the etching of the hard mask layer,
wherein the middle layer comprises a plurality of sublayers, the plurality of sublayers comprising one or more first sublayers comprising a silicon-containing material, and one or more second sublayers comprising Pd or Ni, wherein the first and second sublayers are an alternating pair,
wherein etching the hard mask layer through the patterned middle layer includes a dry-etching process that has a first removal rate of the hard mask layer and a second removal rate of the middle layer, and a ratio of the first removal rate of the hard mask layer to the second removal rate of the middle layer is greater than 5, and
wherein a thickness ratio of the photo resist layer to the middle layer is 1:1 and a thickness ratio of the middle layer to the hard mask layer is 1:1.

2. The method of claim 1, wherein each of the first and second sublayers of the middle layer has a thickness ranging from 1 nm to 30 nm.

3. The method of claim 1, wherein the silicon-containing material comprises one or more from the group consisting of silicon oxide (SiO), silicon oxynitride (SiON), silicon nitride (SiN), silicon boronitride (SiBN), silicon borocarbide (SiBC), silicon boro carbonitride (SiBCN), and polysiloxanes.

4. The method of claim 1, wherein the absorber layer comprises tantalum, or one or more from the group consisting of Ta, Co, Cr, Te, Pt, Pd, Ru, Ir, Ni and their alloys, including nitrides, carbides, oxides, and/or boron derivatives.

5. The method of claim 1, wherein the hard mask layer comprises a metallic layer including Cr or Ta, or one of CrON, TaB, TaO, TaBO or TaBN, or a silicon-based compound from one of SiN or SiON.

6. A method of forming a mask, the method comprising:
providing a mask blank, the mask blank including a reflective multilayer over a substrate, a capping layer disposed on the reflective multilayer, an absorber layer directly over the capping layer, and a hard mask layer directly over the absorber layer;
forming a middle layer over the hard mask layer, wherein the middle layer comprises a plurality of sublayers, the plurality of sublayers comprising a first sublayer comprising a silicon-containing material, and a second sublayer comprising Pd or Ni, wherein the first and second sublayers are an alternating pair;
forming a photo resist layer over the middle layer;
patterning the photo resist layer to generate a patterned photo resist layer;
etching the middle layer through the patterned photo resist layer to generate a patterned middle layer;

removing remaining photo resist layer after etching the middle layer;

after removing the remaining photo resist layer and etching the middle layer, applying a dry-etching process to the hard mask layer through the patterned middle layer to pattern the hard mask layer to generate a patterned hard mask layer;

after the hard mask layer is patterned, removing the middle layer; and patterning the absorber layer using the patterned hard mask layer as an etching mask, wherein the dry-etching process has a first removal rate of the hard mask layer and a second removal rate of the middle layer, and a ratio of the first removal rate of the hard mask layer to the second removal rate of the middle layer is greater than 5, and wherein a thickness ratio of the photo resist layer to the middle layer is 1:1 and a thickness ratio of the middle layer to the hard mask layer is 1:1.

7. The method of claim 6, wherein each of the first and second sublayers has a thickness ranging from 2 nm to 30 nm.

8. The method of claim 6, wherein the hard mask layer comprises CrON and has a thickness between 2 nm to 15 nm, and/or the capping layer comprises ruthenium.

9. The method of claim 6, wherein the silicon-containing material comprises one or more from the group consisting of silicon boronitride (SiBN), silicon borocarbide (SiBC), silicon boro carbonitride (SiBCN), and polysiloxanes.

10. A method of forming a mask, the method comprising:

forming a middle layer on a mask film stack comprising a substrate, a reflective multilayer on the substrate, a capping layer on the reflective multilayer, an absorber layer directly on the capping layer and a hard mask layer directly on the absorber layer;

forming a photo resist layer over the middle layer, wherein the middle layer comprises polysiloxanes;

patterning the photo resist layer;

patterning the middle layer by using the patterned photo resist layer to generate a patterned middle layer;

removing remaining photo resist layer after patterning the middle layer;

patterning the hard mask layer by using the patterned middle layer to generate a patterned hard mask layer after removing the remaining photo resist layer; and patterning the absorber layer by using the patterned hard mask layer as an etching mask, wherein the middle layer comprises a plurality of sublayers, wherein at least one of the sublayers comprises Pd or Ni and at least another of the sublayers comprises polysiloxanes, wherein patterning the hard mask layer includes etching the hard mask layer via a dry-etching process using to the patterned middle layer as a mask, wherein the dry-etching process has a first removal rate of the hard mask layer and a second removal rate of the middle layer, and a ratio of the first removal rate of the hard mask layer to the second removal rate of the middle layer is greater than 5, and wherein a thickness ratio of the photo resist layer to the middle layer is 1:1 and a thickness ratio of the middle layer to the hard mask layer is 1:1.

11. The method of claim 10, wherein each of the sublayers has a thickness ranging from 2 nm to 30 nm.

12. The method of claim 10, further comprising removing the patterned middle layer.

13. The method of claim 1, wherein each of the first and second sublayers has a thickness ranging from 1 nm to 10 nm.

14. The method of claim 1, wherein the middle layer has a thickness of 4 nm to 200 nm.

15. The method of claim 5, wherein the hard mask layer has a thickness between 2 nm to 15 nm.

16. The method of claim 8, wherein the reflective multilayer comprises a plurality of molybdenum and silicon layer pairs up to 50 pairs.

17. The method of claim 6, wherein each of the first and second sublayers has a thickness ranging from 1 nm to 10 nm.

18. The method of claim 1, wherein the capping layer includes Ru, RuB, RuSi, RuNb, $RuO_2$, or RuNbO.

19. The method of claim 6, wherein the capping layer has a thickness of 3.5 nm±10%.

20. The method of claim 10, wherein the capping layer includes a Si layer.

* * * * *